United States Patent
Jeong et al.

(10) Patent No.: US 8,216,932 B2
(45) Date of Patent: Jul. 10, 2012

(54) METHOD OF MANUFACTURING SEMICONDUCTOR DEVICES HAVING METAL LINES

(75) Inventors: Cheol Mo Jeong, Incheon-Si (KR); Eun Soo Kim, Incheon-Si (KR); Seung Hee Hong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 762 days.

(21) Appl. No.: 12/345,611

(22) Filed: Dec. 29, 2008

(65) Prior Publication Data

US 2009/0179329 A1    Jul. 16, 2009

(30) Foreign Application Priority Data

Jan. 14, 2008  (KR) .................. 10-2008-0003902

(51) Int. Cl.
*H01L 21/4763* (2006.01)
(52) U.S. Cl. ........ 438/627; 438/622; 438/643; 438/672; 438/675; 257/751; 257/758; 257/774; 257/752
(58) Field of Classification Search .............. 438/629, 438/637, 639, 640, 667, 668, 672, 675, 700, 438/701, 978, 622, 618, 627, 643, 653; 257/774, 257/700, 750, 751, 752, E21.585, 758, 618, 257/762

See application file for complete search history.

(56) References Cited

U.S. PATENT DOCUMENTS

| | | | |
|---|---|---|---|
| 6,194,235 B1 * | 2/2001 | Ma | 438/14 |
| 6,537,913 B2 * | 3/2003 | Modak | 438/687 |
| 2005/0287803 A1 * | 12/2005 | Lee | 438/672 |

FOREIGN PATENT DOCUMENTS

| | | |
|---|---|---|
| JP | 2000-323479 | 11/2000 |
| KR | 10-2003-0053542 | 7/2003 |
| KR | 10-2005-0013845 | 2/2005 |

* cited by examiner

*Primary Examiner* — Ha Tran T Nguyen
*Assistant Examiner* — Thanh Y Tran
(74) *Attorney, Agent, or Firm* — Marshall, Gerstein & Borun LLP

(57) ABSTRACT

The present invention relates to semiconductor devices and a method of fabricating the same. According to a method of manufacturing semiconductor devices, there is first provided a semiconductor substrate in which a first pre-metal dielectric layer including trenches is formed. A diffusion barrier layer is formed on the entire surface including the trenches. A metal layer is formed on the diffusion barrier layer including the trenches, thereby gap-filling the trenches. A polish etching process is performed on the metal layer and the diffusion barrier layer so that the diffusion barrier layer and the metal layer remain within the trenches. An etching process of lowering a height of the metal layer is performed in order to increase a distance between metal lines. A capping layer is formed on the entire surface including exposed sidewalls of the first pre-metal dielectric layer. A second pre-metal dielectric layer is formed over the capping layer.

11 Claims, 3 Drawing Sheets

METHOD OF MANUFACTURING SEMICONDUCTOR DEVICES HAVING METAL LINES

CROSS-REFERENCES TO RELATED APPLICATION

The present application claims priority to Korean patent application number 10-2008-003902, filed on Jan. 14, 2008, which is incorporated by reference in its entirety.

BACKGROUND OF THE INVENTION

The present invention relates to semiconductor devices and a method of fabricating the same and, more particularly, to semiconductor devices and a method of fabricating the same, which is capable of reducing the occurrence of bridges between metal lines.

With the higher integration of semiconductor circuits, Cu metal lines having low resistance are increasingly used as lines of the semiconductor circuits. However, a process of forming Cu lines cannot use a process of depositing a metal layer and then forming lines using photolithography and etching processes, which is applied to a conventional metal line formation process, due to the problems of dry etch. Accordingly, the process of forming Cu lines uses a damascene process of forming via hole or trenches, corresponding to line patterns, over a substrate, gap-filling the via holes or the trenches using an electro-plating process, and then etching Cu lines protruded over the substrate using a Chemical Mechanical Polishing (CMP) process.

As a pattern pitch recently becomes 100 nm or less, a bridge margin between Cu lines becomes short although a normal pattern profile is achieved. Bridges are caused because Cu residua, reacting to oxide at an interface after CMP, remain or Cu ions remaining in slurries at the time of CMP are absorbed by a patterned substrate again. Further, some scratches occurring at the time of CMP are all caused to generate bridges. At the current level of technology, in devices of 30 nm or less, Cu lines cannot be used due to the occurrence of bridges. Accordingly, there is an urgent need for this problem.

BRIEF SUMMARY OF THE INVENTION

The present invention is directed towards semiconductor devices and a method of fabricating the same, which is capable of securing a bridge margin between metal lines and also greatly reducing the occurrence of bridges, when forming the metal lines using a damascene process.

According to a method of manufacturing semiconductor devices in accordance with an aspect of the present invention, there is first provided a semiconductor substrate in which a first pre-metal dielectric layer including trenches is formed. A diffusion barrier layer is formed on the entire surface including the trenches. A metal layer is formed on the diffusion barrier layer including the trenches, thereby gap-filling the trenches. A polish etching process is performed on the metal layer and the diffusion barrier layer so that the diffusion barrier layer and the metal layer remain within the trenches. An etching process of lowering a height of the metal layer is performed in order to increase a distance between metal lines. A capping layer is formed on the entire surface including exposed sidewalls of the first pre-metal dielectric layer. A second pre-metal dielectric layer is formed over the capping layer.

After the second pre-metal dielectric layer is formed, a polish etching process may be performed on the second pre-metal dielectric layer, the capping layer, and the first pre-metal dielectric layer in order to remove the first pre-metal dielectric layer, which has been exposed to metallic materials when the polish etching process is performed on the metal layer and therefore contaminated, and a third pre-metal dielectric layer may be formed over the first pre-metal dielectric layer, the capping layer, and the second pre-metal dielectric layer.

The diffusion barrier layer may have a stack layer of Ta/TaN. The metal layer may be formed from copper (Cu). The Cu may be formed using an electro-plating method. The polishing process may be performed using a Chemical Mechanical Polishing (CMP) process.

The etching process of lowering the height of the metal layer may be performed using a wet dip-out process. The wet dip-out process may be performed using an acid solution.

When the etching process of lowering the height of the metal layer is performed, the metal layer may remain to a target height of the metal lines. When the etching process of lowering the height of the metal layer is performed, part of the diffusion barrier layer may be etched, thereby exposing an upper portion of sidewalls of the first pre-metal dielectric layer. The etching process of lowering the height of the metal layer is performed causes a distance between the metal lines to increase as much as a distance corresponding to twice a depth from a surface of the first pre-metal dielectric layer to a surface of the lowered metal layer.

The capping layer may be formed from a nitride layer. The polish etching process may be stopped before the metal lines are exposed.

A semiconductor device according to an aspect of the present invention may include a first pre-metal dielectric layer formed to include trenches, a diffusion barrier layer formed on bottoms and sidewalls of the trenches, wherein the diffusion barrier layer has a height lower than that of the first pre-metal dielectric layer at the bottoms, metal lines formed within the diffusion barrier layer, a capping layer formed on the entire surface of the first pre-metal dielectric layer over the metal lines and the diffusion barrier layer, and a second pre-metal dielectric layer formed over the capping layer.

A semiconductor device according to another aspect of the present invention may include a first pre-metal dielectric layer formed to include trenches, a diffusion barrier layer formed on bottoms and sidewalls of the trenches, wherein the diffusion barrier layer has a height lower than that of the first pre-metal dielectric layer at the bottoms, metal lines formed within the diffusion barrier layer, a capping layer formed on sidewalls of the first pre-metal dielectric layer over the metal lines and the diffusion barrier layer, a second pre-metal dielectric layer formed within the capping layer together with the first pre-metal dielectric layer, and a third pre-metal dielectric layer formed over the first pre-metal dielectric layer, the capping layer, and the second pre-metal dielectric layer.

The diffusion barrier layer may have a stack layer of Ta/TaN. The metal layer may be formed from copper (Cu). The capping layer may be formed from a nitride layer.

DESCRIPTION OF SPECIFIC EMBODIMENT

Figure 1A:
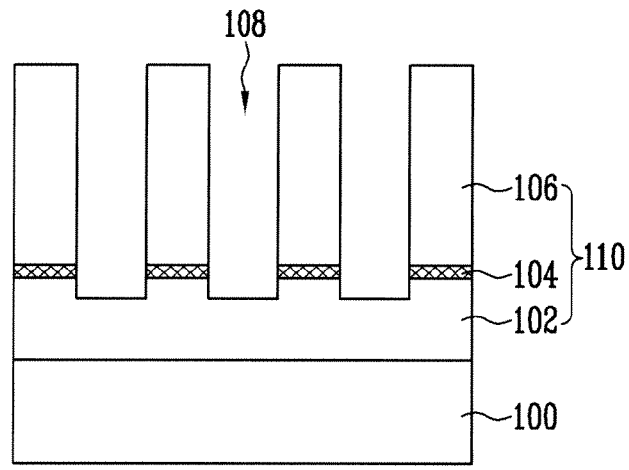
FIGS. 1A to 1H are sectional views showing a method of manufacturing semiconductor devices according to an embodiment of the present invention.

Hereinafter, the present invention will be described in detail in connection with a specific embodiment with reference to the accompanying drawings. The present embodiment is provided to complete the disclosure of the present invention and to allow those having ordinary skill in the art to understand the scope of the present invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

FIGS. 1A to 1H are sectional views showing a method of manufacturing semiconductor devices according to an embodiment of the present invention.

Referring to FIG. 1A, a first pre-metal dielectric layer 102, an etch-stop layer 104 and a second pre-metal dielectric layer 106 are sequentially formed over a semiconductor substrate 100 in which specific elements, such as gates (not shown) and junctions (not shown), are formed. The first and second pre-metal dielectric layers 102 and 106 may include all kinds of oxide-based materials. They may be formed from any one selected from, for example, Spin On Glass (SOG), Boron-Phosphorus Silicate Glass (BPSG), Plasma Enhanced Tetra Ethyl Ortho Silicate (PETEOS), Undoped Silicate Glass (USG), and Phosphorus Silicate Glass (PSG) or a High Density Plasma (HDP) oxide layer. The second pre-metal dielectric layer 106 may be formed to a thickness of 1000 to 2000 Å. The etch-stop layer 104 is formed from materials, having an etch selectivity different from that of the first and second pre-metal dielectric layers 102 and 106, and may be preferably formed from nitride-based materials, such as a silicon nitride layer ($Si_3N_4$) or a silicon oxynitride layer (SiON). The etch-stop layer 104 may be formed to a thickness of 200 to 300 Å.

Next, the second pre-metal dielectric layer 106 is etched in order to form trenches in the second pre-metal dielectric layer 106. The etching process is performed using a dry etch process so that etching is stopped at the etch-stop layer 104. Accordingly, trenches 108 are formed in the second pre-metal dielectric layer 106. Meanwhile, in the etching process of forming the trenches 108, the etch-stop layer 104 and the first pre-metal dielectric layer 102 may be partially etched. The second pre-metal dielectric layer 106, the etch-stop layer 104, and the first pre-metal dielectric layer 102, including the trenches 108 as described above, are generally called damascene pattern 110.

Figure 1B:
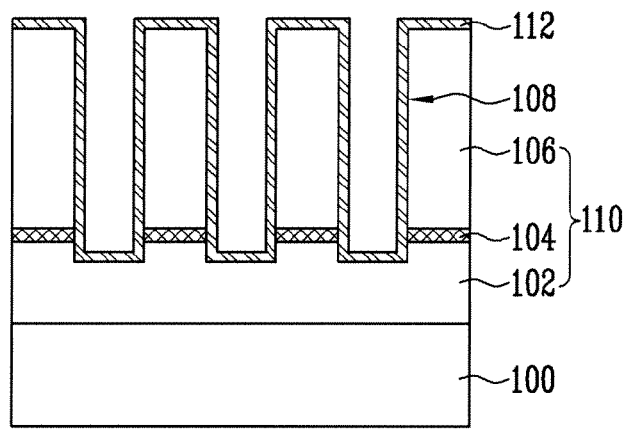

Referring to FIG. 1B, a diffusion barrier layer 112 is formed on the entire surface of the trenches 108. The diffusion barrier layer 112 may have a stack layer of tantalum (Ta)/tantalum nitride (TaN) in liner form.

Figure 1C:
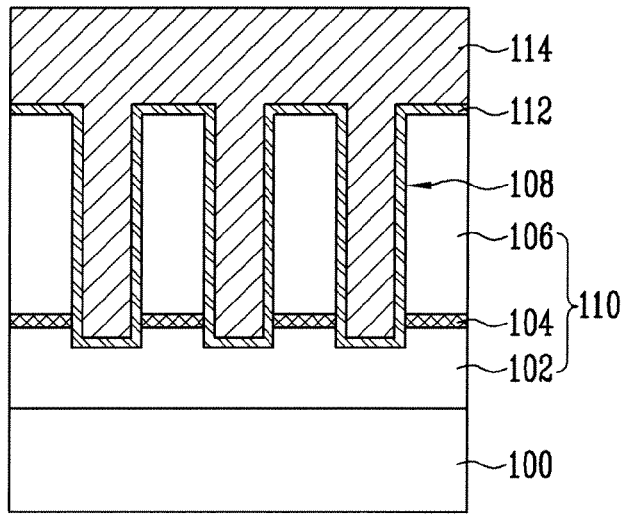

Referring to FIG. 1C, a metal layer 114 is formed on the diffusion barrier layer 112, including the trenches 108, so that the trenches 108 are gap-filled. The metal layer 114 is preferably formed from Cu so that metal lines to be formed later have low resistance. In this case, the metal layer 114 may be formed using an electro-plating method. The electro-plating method is advantageous in that it is easy to handle, and has a fast growth speed, a relatively simple chemical reaction, and a good durability against Electro-Migration (EM) because a good film quality having a large grain size can be obtained. The metal layer 114 may be formed to a thickness of 5000 to 10000 Å.

Figure 1D:
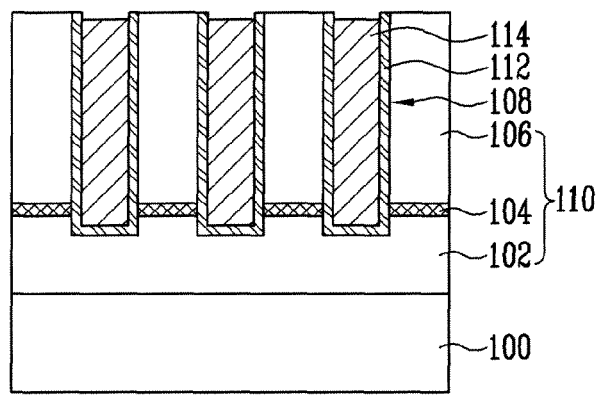

Referring to FIG. 1D, a polish etching process is performed on the metal layer 114 until the second pre-metal dielectric layer 106 is exposed. Here, the polishing process may be performed using a CMP process. Accordingly, the metal layer 114 and the diffusion barrier layer 112 over the second pre-metal dielectric layer 106 are etched, so the metal layer 114 and the diffusion barrier layer 112 remain only within the trenches 108. Further, a top surface of the second pre-metal dielectric layer 106 is exposed.

However, in the CMP process performed on the metal layer 114, the second pre-metal dielectric layer 106 is exposed to metallic materials, and therefore the top surface of the second pre-metal dielectric layer 106 is contaminated. In this case, if the metal layer 114 forms metal lines, bridges may occur between the metal lines. Further, metal ions remaining in slurries at the time of the CMP process are absorbed on the metal layer 114 and the second pre-metal dielectric layer 106, thus causing bridges. Accordingly, in order to greatly reduce the occurrence of bridges, the metallic materials and/or the metal ions must be removed in a subsequent process. This process is described later.

However, in devices of 30 nm or less, a distance between the metal layers 114 is narrow. Thus, although factors to cause the occurrence of bridges are removed as described above, a bridge margin is very insufficient.

Figure 1E:
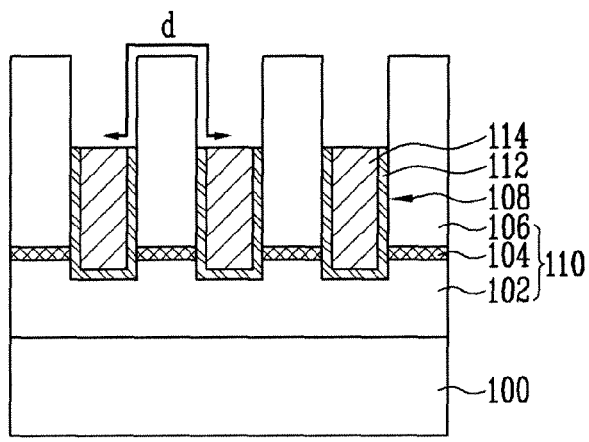

Referring to FIG. 1E, an etching process is performed on the metal layer 114 in order to lower the height of the metal layer 114 and the diffusion barrier layer 112. The etching process may be performed using a wet etch process. Here, the wet etching process may be performed using a wet dip-out process using an acid solution, such as sulphuric acid ($H_2SO_4$) or nitric acid ($HNO_3$).

This wet dip-out process causes part of the metal layer 114 to be etched and, therefore, the height of the metal layer 114 to be lowered. Meanwhile, the wet dip-out process also causes the diffusion barrier layer 112 to be partially etched, so the height of the diffusion barrier layer 112 is lowered. Accordingly, since the metal layer 114 and the diffusion barrier layer 112 are partially etched, upper portions of sidewalls of the second pre-metal dielectric layer 106 is exposed. At this time, a process condition at the time of the wet dip-out process can be properly controlled such that the height of the remaining metal layer 114 becomes a target height of metal lines to be formed finally.

If the height of the metal layer 114 is lowered as described above, a distance 'd' between the metal layers 114 with an interface, that is, the second pre-metal dielectric layer 106 intervened therebetween increases as much as a distance, which is corresponds to twice a depth from the surface of the second pre-metal dielectric layer 106 to a surface of the lowered metal layer 114, as compared with FIG. 1D. Consequently, the distance 'd' is 2 to 3 times greater than that of an existing distance.

As described above, if the distance between the metal layers 114 with the interface intervened therebetween increases, a distance between metal lines to be formed later increases. Accordingly, a bridge margin between the metal lines can be secured, so the occurrence of bridges can be reduced greatly.

Further, at the time of the wet dip-out process, the second pre-metal dielectric layer 106 is also partially etched. Due to this, a top surface of the second pre-metal dielectric layer 106, which has been exposed to metallic materials at the time of the CMP process and thus contaminated, is also removed. Accordingly, a bridge margin can be secured. Furthermore, metal ions remaining in the slurries at the time of the CMP process are removed by the wet dip-out process, thus preventing a bridge between metal lines to be formed later. Accordingly, the occurrence of bridges can be reduced greatly.

Figure 1F:
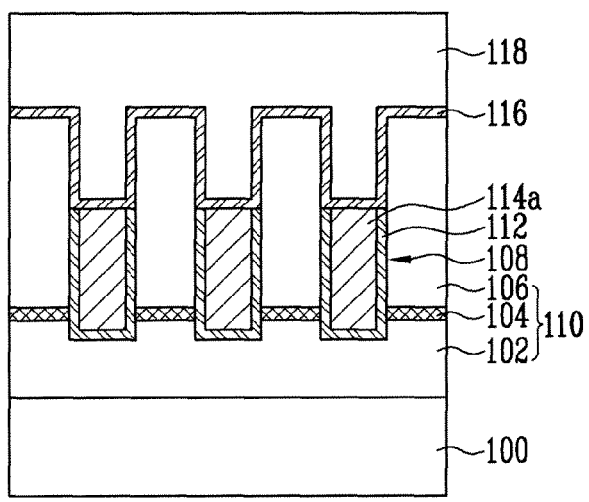

Referring to FIG. 1F, a capping layer 116 of liner form is formed on the entire surface of the second pre-metal dielectric layer 106, including the metal layer 114. The capping layer 116 may be preferably formed from a nitride layer in order to provide insulation among metal lines. The capping layer 116 functions to prevent metallic materials from spreading.

A third pre-metal dielectric layer 118 is formed on the capping layer 116, thus completing the formation of metal lines 114a. The third pre-metal dielectric layer 118 may use all kinds of insulating materials.

According to an embodiment of the present invention, since the etching process of lowering the height of the metal layer 114 is performed, a distance between the metal lines 114a increases and a bridge margin is secured. Accordingly, the occurrence of bridges can be reduced greatly. Further, while lowering the height of the metal layer 114, a top surface of the second pre-metal dielectric layer 106, which has been exposed to metallic materials at the time of the CMP process and thus contaminated, is removed, and metal ions remaining in slurries at the time of CMP are also removed. Accordingly, the occurrence of bridges between the metal lines is prevented, so the occurrence of bridges can be reduced greatly.

As described above, the process can be finished in FIG. 1F in order to secure a bridge margin between the metal lines 114a and also reduce the occurrence of bridges. However, as described above, although factors to cause the occurrence of bridges are removed in devices of 30 nm or less, a sufficient bridge margin cannot be achieved. Accordingly, a subsequent process, which can apply to devices of 30 nm or less, is added in order to achieve a sufficient bridge margin between metal lines and also significantly reduce the occurrence of bridges.

Figure 1G:
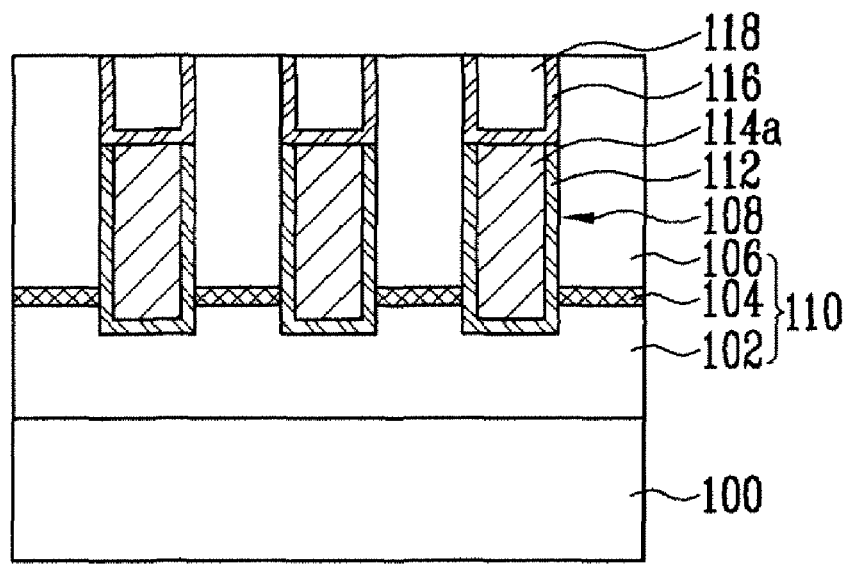

Referring to FIG. 1G, an etching process is performed on the second pre-metal dielectric layer 106 in order to remove the second pre-metal dielectric layer 106, which has been exposed to metallic materials at the time of the CMP process and thus contaminated in FIG. 1D. Here, the etching process may be performed using a CMP process. It is preferred that the CMP process be performed in such a way as to fully remove the contaminated second pre-metal dielectric layer 106. Polishing is stopped before the metal lines 114a are exposed. Accordingly, the third pre-metal dielectric layer 118, the capping layer 116, and the second pre-metal dielectric layer 106 are partially etched.

As described above, since the second pre-metal dielectric layer 106 is partially etched by the polishing process, a top surface of the second pre-metal dielectric layer 106, which has been exposed to metallic materials at the time of the CMP process and thus contaminated, is fully removed, and particles remaining when the CMP process is performed on the metal layer 114 are all removed. Accordingly, a more sufficient bridge margin between the metal lines 114a can be secured, and the occurrence of bridges can be further reduced. Moreover, since particles remaining at the time of the CMP process are all removed, the throughput can be improved.

Accordingly, since metal lines of devices of 30 nm or less can be formed from Cu, metal lines having low resistance can be implemented. Consequently, RC delay can be reduced and, therefore, the operating speed of devices can be further improved.

Figure 1H:
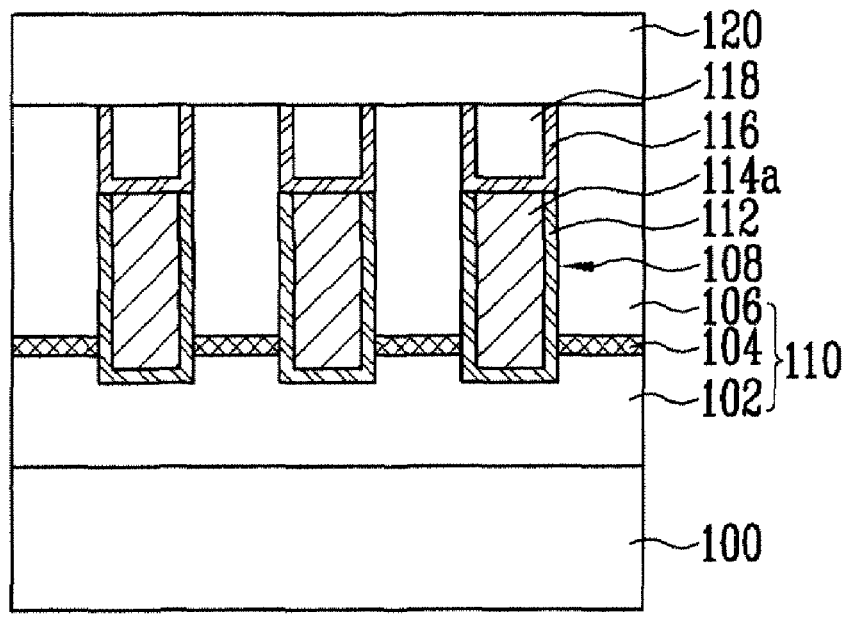

Referring to FIG. 1H, a fourth pre-metal dielectric layer 120 is formed on the second pre-metal dielectric layer 106, the capping layer 116, and the third pre-metal dielectric layer 118, thus completing the metal line formation process. Here, the fourth pre-metal dielectric layer 120 may use all kinds of insulating materials.

According to the present invention, in the case in which metal lines are formed using a damascene process, a polishing process is performed on a metal layer in order to form the metal lines, and an etching process is then performed in order to lower the height of the metal layer, so a distance between the metal lines with an interface intervened therebetween can be increased. Accordingly, a sufficient bridge margin can be achieved. Further, an oxide layer, which has been exposed to metal at the time of the polishing process and thus contaminated, and particles are all removed. Accordingly, the occurrence of bridges between the metal lines can be reduced significantly.

As described above, since metal lines of devices of 30 nm or less can be formed from Cu, metal lines having low resistance can be implemented. Accordingly, RC delay can be reduced and, therefore, the operating speed of devices can be further enhanced.

The embodiment disclosed herein has been proposed to allow a person skilled in the art to easily implement the present invention, and the person skilled in the part may implement the present invention in various ways. Therefore, the scope of the present invention is not limited by or to the embodiment as described above, and should be construed to be defined only by the appended claims and their equivalents.

What is claimed is:

1. A method of manufacturing semiconductor devices having metal lines, the method comprising:
   forming a first pre-metal dielectric layer having a trench on a semiconductor substrate;
   forming a diffusion barrier layer on an entire surface of the first pre-metal dielectric layer including the trench;
   forming a metal layer on the diffusion barrier layer to fill the trench;
   performing a polish etching process on the metal layer to expose a top surface of the first pre-metal dielectric layer, wherein portions of the metal layer and the diffusion layer are exposed between the exposed first pre-metal dielectric layer;
   performing an etching process to lower a height of the metal layer to increase a distance between metal lines so that a portion of side walls of the first pre-metal dielectric layer is exposed;
   forming a capping layer along an entire surface after performing the etching process;
   forming a second pre-metal dielectric layer over the capping layer;
   performing a polish etching process on the second pre-metal dielectric layer, the capping layer, and a portion of the first pre-metal dielectric layer; and
   forming a third pre-metal dielectric layer over the first pre-metal dielectric layer, the capping layer, and the second pre-metal dielectric layer.

2. The method of claim 1, wherein the diffusion barrier layer has a stack layer of Ta/TaN.

3. The method of claim 1, wherein the metal layer is formed from copper (Cu).

4. The method of claim 3, wherein the Cu is formed using an electro-plating method.

5. The method of claim 1, wherein the etching process to lower the height of the metal layer is performed using a wet dip-out process.

6. The method of claim 5, wherein the wet dip-out process is performed using an acid solution.

7. The method of claim 1, wherein, when the etching process to lower the height of the metal layer is performed, the metal layer remains to a target height of the metal lines.

8. The method of claim 1, wherein, when the etching process to lower the height of the metal layer is performed, a portion of the diffusion barrier layer is etched, thereby exposing an upper portion of sidewalls of the first pre-metal dielectric layer.

9. The method of claim 1, wherein the etching process to lower the height of the metal layer is performed causes a distance between the metal lines to increase as much as a distance corresponding to twice a depth from a surface of the first pre-metal dielectric layer to a surface of the lowered metal layer.

10. The method of claim 1, wherein the capping layer comprises a nitride layer.

11. The method of claim 1, wherein the polish etching process is stopped before the metal lines are exposed.

* * * * *